United States Patent [19]

Alzati

[11] Patent Number: 4,901,191
[45] Date of Patent: * Feb. 13, 1990

[54] MONOLITHICALLY INTEGRATABLE, LOW POWER DISSIPATION CONTROL CIRCUIT FOR SWITCHING INDUCTIVE LOADS

[75] Inventor: Angelo Alzati, Bollate, Italy

[73] Assignee: SGSATES Componenti Elettronici S.p.A., Italy

[ * ] Notice: The portion of the term of this patent subsequent to Dec. 13, 2004 has been disclaimed.

[21] Appl. No.: 707,025

[22] Filed: Feb. 28, 1985

[30] Foreign Application Priority Data

Feb. 29, 1984 [IT] Italy ............................ 19859 A/84

[51] Int. Cl.⁴ .............................................. H01H 47/00
[52] U.S. Cl. ...................................... 361/152; 307/262
[58] Field of Search ......................... 307/262; 361/152

[56] References Cited

U.S. PATENT DOCUMENTS 2,862,171  11/1958  Freeborn ........................ 307/239 X
4,280,761   7/1981  Ogawa et al. .................. 361/152 X Primary Examiner—Michael L. Gellner
Attorney, Agent, or Firm—Harry M. Weiss

[57] ABSTRACT

A control circuit is disclosed for switching current through a load impedance coupled in a bridge across two output terminals. The circuit comprises two power amplifiers, each power amplifier having a first and a second stage. The two power amplifiers are switched by an input stage which, depending on the level of a logic control signal, turns on the first stage of one of the two amplifiers and permits turning on of the second stage of the other amplifier. The second stage is alternately turned on and turned off by a regulating circuit. The first stage of each amplifier comprises two diodes interconnected in series in opposite directions of conduction and having their common terminal coupled to the input terminal of the first stage. This configuration substantially reduces the power dissipated by the first stage when the second stage of the other amplifier is turned off by the regulating circuit.

12 Claims, 2 Drawing Sheets

MONOLITHICALLY INTEGRATABLE, LOW POWER DISSIPATION CONTROL CIRCUIT FOR SWITCHING INDUCTIVE LOADS

BACKGROUND OF THE INVENTION

1. Field of the Invention

This invention relates to a monolithically integratable control circuit for switching currents through inductive load impedances coupled in a bridge circuit across two output terminals of a power amplifier.

2. Discussion of the Related Art

A control circuit for switching inductive loads coupled in a bridge configuration comprises tow power amplifiers, each comprising two interconnected stages, one stage of which is commonly called the "source" stage whereas the other stage is called the "sink" stage. The junction point between the two stages is coupled to an output terminal of the amplifier.

The load impedance is coupled in a bridge circuit between the output terminals of the two power amplifiers. The power amplifiers are switched by an input stage which, depending on the level of a logic control signal, turns on the source stage of one of the two amplifiers and simultaneously allows turning on of the sink stage of the other amplifier. The sink stage is also switched on and off by an actuating stage which switches as a function of the value of the current passing through a load impedance. When the actuating stage turns off the sink stage, a recycling diode disposed between the amplifier output and the power supply discharges the energy accumulated in the load inductance, and the source stage of the other amplifier remains turned on and continues to dissipate power.

As is known, the dissipation in power devices is high. The packages containing such devices must not only be adapted to dispose of the heat due to the high power dissipation, but must also be very small to avoid excessive cost. It is therefore extremely important to take steps to reduce the power dissipation of the aforementioned devices, at least during certain time intervals.

In a control circuit of the previously-described kind, it is particularly advantageous to limit the power dissipation of the source stage of an amplifier during the times when the sink stage of the other amplifier is turned off. To this end, there is a known method, which will be explained hereinafter in the description, for reducing the voltage drop across the source stage and thus reducing the power dissipated thereby during the aforementioned time intervals. This method, however, results in a deterioration in the operation of the control circuit, i.e. an increase in the power dissipated by the source stage when the sink stage is turned on.

SUMMARY OF THE INVENTION

It is therefore an object of the present invention to provide an improved switching amplifier for inductive load impedances.

It is another object of the invention is to provide a control circuit for switching currents through inductive load impedances coupled in a bridge, in which the power dissipated by the source stage of a first amplifier decreases when the sink stage of a second amplifier is turned off by the actuating stage without adversely affecting the operation of the source stage when the sink stage is turned on.

The aforementioned and other objects are accomplished, according to the present invention, by two power amplifiers between which a load impedance is coupled in a bridge circuit configuration. Each power amplifier has a sink stage and a source stage. The source of one power amplifier is typically activated along with the sink stage of the other power amplifier. When the current through an activated sink stage exceeds a predetermined value, the sink stage is inactivated and the current through the load impedance returned, via a diode, to the power supply. To reduce the power dissipation, a transistor and a biasing resistor normally used to bias output power transistors in the amplifiers are replaced by two diodes. This component replacement results in lower voltage across the output power transistors and therefore low power dissipation in the elements.

These and other features of the invention will be understood upon reading the following detailed description of the preferred embodiment, described with reference to the accompanying drawings.

OPERATION OF THE PREFERRED EMBODIMENT

Figure 1:
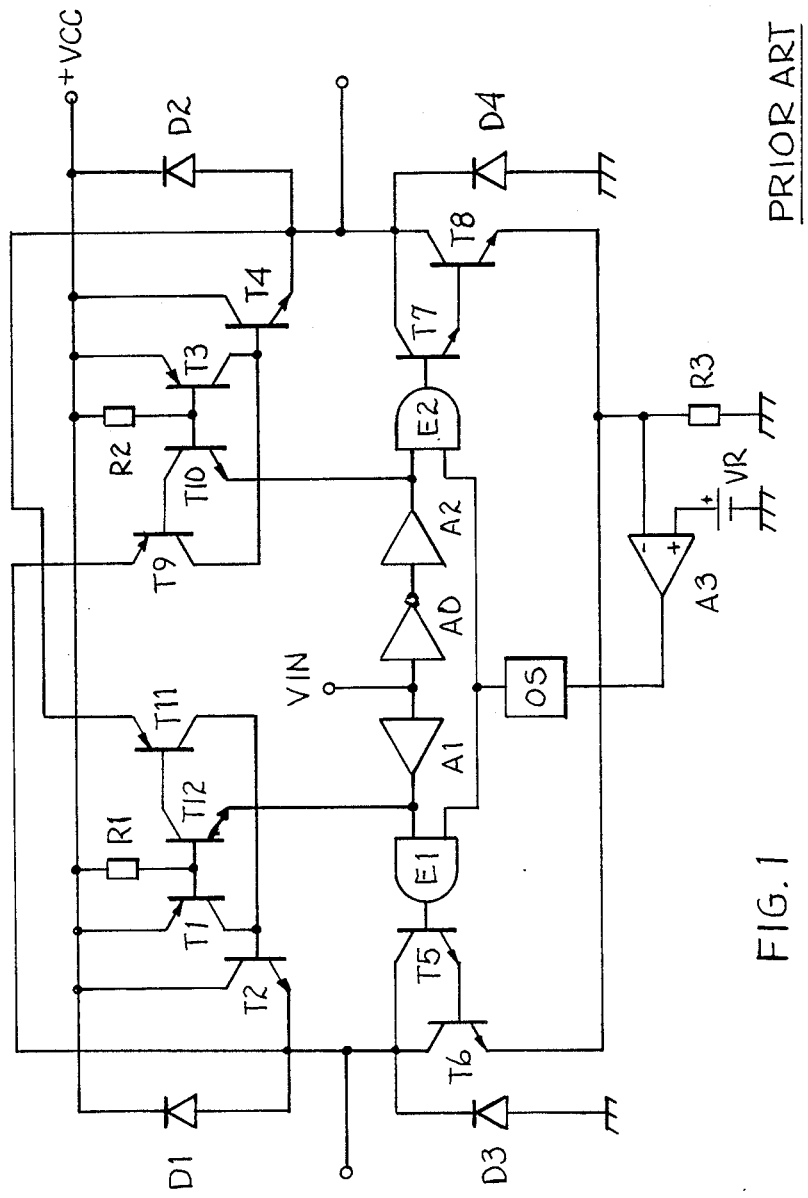
FIG. 1 is a simplified diagram of a known circuit for switching inductive loads coupled in a bridge configuration.

FIG. 1 shows a control circuit comprising two similar, symmetrically disposed power amplifiers. A first amplifier comprises a first power stage, commonly called the source (and hereinafter called source 1) including four bipolar transistors T2, T1, T12 and T11 and a resistor R1, and a second power stage, commonly called the sink (hereinafter called sink 1) comprising a pair of bipolar transistors T5 and T6 interconnected in a Darlington circuit configuration. The second power amplifier likewise comprises source stage (source 2) made up of four bipolar transistors T4, T3, T10 and T9 and a resistor R2, and a sink stage (sink 2) comprising a pair of bipolar transistors T7 and T8 in a Darlington circuit configuration.

In the illustrated circuit, transistors T1 and T3 are of PNP type and have their emitter terminals coupled to the positive terminal $+V_{cc}$ of a supply voltage source and their collector terminals coupled to the base terminals of transistors T2 and T4 respectively. The base terminals of transistors T1 and T3 are respectively coupled to the base terminals of T12 and T10 and are also coupled to the positive supply terminal $+V_{cc}$ via resistors R1 and R2 respectively. Transistors T2 and T4 are NPN power transistors whose collector terminals are coupled to the positive supply terminal $+V_{cc}$, whereas their emitter terminals are the output terminals of source stage 1 and source stage 2 respectively.

The emitter terminal of T2 is coupled to the emitter of PNP transistor T9, which belongs to the source stage 2 and has its base and collector terminals, respectively, coupled to the collector terminal of transistor T10 and the base terminal of transistor T4. The emitter terminal of transistor T4 is coupled to the emitter terminal of PNP transistor T11 belonging to the source stage 1, and its base and collector terminals are, respectively, coupled to the collector terminal of transistor T12 and the base of transistor T2.

Transistors T12 and T10 are NPN-type and their emitter terminals are the input terminals of source 1 and source 2, respectively and are respectively coupled to a first and a second output terminal of a circuit constituting the input stage of the control circuit.

As is known to those skilled in the art, transistors T11 and T12 and transistors T9 and T10 are adapted to reduce the power dissipation in source 1 and source 2 respectively when the sink stages are turned off.

The input stage comprises an inverter amplifier A0 and two operational amplifiers A1 and A2. The input terminals of amplifiers A1 and A0 are coupled together and form the input terminal of the stage, to which a logic signal VIN is applied. The output terminal of amplifier A0 is coupled to the input terminal of A2. The output terminals of amplifiers A1 and A2 are, respectively, the first and second output of the input stage and are respectively coupled to a first input terminal of logic AND gate E1 and to a first input terminal of logic AND gate E2 and are also respectively coupled to the emitter terminal of transistor T12 and the emitter terminal transistor T10.

The input stage, via the emitter terminal of transistors T12 and T10, switches the source stages of the two amplifiers, turning them on alternately in dependence on the level of the input signal VIN.

The output terminal of logic AND gate E1 is coupled to the base terminal of transistor T5, which is the input terminal of the sink stage 1; similarly, the output terminal of logic AND gate E2 is coupled to the base terminal of transistor T7, which is the input terminal of the sink stage 2.

Transistors T5 and T7 are NPN-type and are respectively coupled in Darlington circuit configuration to power transistors T6 and T8, likewise of the NPN type. More specifically, the emitter terminals of transistors T5 and T7 are respectively coupled to the base terminals of transistors T6 and T8 and the collector terminals of transistors T5 and T6, in a manner similar to the collector terminals of transistors T7 and T8, are coupled together and form the terminal of a first output terminal of the corresponding sink stage.

The emitter terminals of transistors T6 and T8 constitute the terminals of a second output terminal of sink stage 1 and sink stage 2 respectively. The emitter terminals are coupled to one another and also coupled via a resistor R3 to the negative terminal (indicated by the earth or common symbol) of the supply voltage source. They are also coupled to the inverting (−) input terminal of an operational amplifier A3, whose non-inverting (+) input terminal is coupled to a positive reference voltage source VR. The output terminal of amplifier A3 is the input of a monostable multivibrator, represented by a block OS, whose output terminal is coupled to a second input terminal of logic AND gate E1 and logic AND gate E2.

Operational amplifier A3, voltage source VR, resistor R3 and monostable multivibrator OS are the components of a regulating circuit which ensures that the current through the load impedance is kept at approximately the desired value.

The input stage and the regulating circuit switch the sink stages of the two amplifiers via logic AND gates E1 and E2. More specifically, depending on the level of the logic signal VIN, the input stage turns on the source stage of one of the two amplifiers and switches the first input of the logic AND gate to the high level, actuating the sink stage of the other amplifier, whereas the actuating circuit alternately switches the second input of the gate to the high level or the low level, depending on the current in the load impedance, so as respectively to turn on or off the sink stage coupled to the gate.

The control circuit shown in FIG. 1 also comprises four recycling diodes D1, D2, D3 and D4. D1 and D2 have their cathodes coupled to the positive supply terminal $+V_{cc}$ and their anodes coupled to the emitter terminal of transistor T2 and the emitter terminal of transistor T4 respectively. Diodes D3 and D4 have their anode terminals coupled to the earth (or common) terminal and their cathode terminals coupled to the collector terminal of transistor T3 and the collector terminal of transistor T8 respectively.

The emitter terminal of transistor T2 and the collector terminal of transistor T6 are coupled together and constitute the output terminal of the first power amplifier. Similarly, the emitter terminal of transistor T4 and the collector terminal of transistor T8 are coupled together and constitute the output terminal of the second power amplifier. An inductive load impedance, e.g. a stepping motor (not shown in the drawing), is coupled between the two output terminals of the control circuit and is switched via the two power amplifiers.

The operation of the aforementioned control circuit will now be examined in greater detail.

When the input logic signal VIN is at the low level, the output of amplifier A1 is also at low level and transistor T12 is conductive, so that the source stage 1 is turned on. The output terminal of amplifier A1 is also one of the two inputs of logic AND gate E1 so that the output of terminal E1 is also at low level (as is known, the output of logic AND gate is at the high level only if both its input terminals are at high level) and transistors T5 and T6 are turned off.

Consequently, when VIN is at low level, the source stage of the first power amplifier is turned on and the sink stage thereof is turned off. The source stage of the second power amplifier, on the other hand, is turned off because, since the level of the input signal is inverted by amplifier A0, the output terminal of amplifier A2 is at the high level and transistors T10, T9, T3 and T4 are blocked. The output of terminal amplifier A2 is also coupled to one of the two input terminals of logic AND gate E2. When the second input terminal of gate E2, or the output terminal of multivibrator OS, is also at high level, the output terminal of gate E2 is at high level and transistors T7 and T8 are conductive and therefore sink stage 2 is turned on. When the output of multivibrator OS is at low level, the output of gate E2 is at low level and transistors T7 and T8 are blocked.

When transistors T7 and T8 are turned off, the voltage drop across resistor R3 is zero and consequently the voltage applied to the inverting input of A3 is less than the reference voltage VR and the corresponding output is therefore at the high level and multivibrator OS is in the stable state, corresponding to an output terminal at high level. In the previously-described situation, therefore, where a low-level input signal VIN is applied and the output of amplifier A2 is at high level, the output of logic AND gate E2 switches to high level and transistors T7 and T8 are turned on, so that a current flows through the circuit comprising source 1, the load impedance and sink 2 coupled in series. The current progressively increases in accordance with a time constant which depends on the value of the load impedance inductance.

The voltage drop across resistor R3 increases in proportion to the current. When the voltage exceeds the reference voltage VR, the output terminal of amplifier A3 switches to low level and changes the state of multivibrator OS, which moves to the quasistable state corresponding to an output signal at low level. Consequently, the output terminal of gate E2 also descends to low level and the sink stage 2 is turned off, whereas diode D2 becomes conductive and discharges the load inductance.

When the sink stage 2 is turned off, the voltage drop across resistor R3 disappears and the output terminal of amplifier A3 returns to the high level. After a preset time interval, which is determined in dependence on the load characteristics by a suitable external delay network (not shown in the drawing) the monostable multivibrator returns to the stable state and its output switches to high level. Consequently, the output terminal of gate E2 moves to the high level, the sink stage 2 is turned on and the current in the load impedance increases.

As previously stated, when VIN is at low level, the source stage 1 is turned on. The condition of the transistors therein, however, varies depending whether the sink stage 2 is turned off or on.

When sink 2 is turned on, all four transistors in source stage 1 are conductive. Between the emitter terminal and base terminal of transistor T1, there is a voltage drop VBE (equal to approximately 0.7 V) and an equal voltage drop between the base terminal and emitter terminal of transistor T12, so that the emitter terminal of transistor T12 is at the voltage $V_{cc}-2$ VBE. Between the collector terminal and the emitter terminal of transistor T12 there is a voltage drop VSAT (equal to approx. 0.1 V), so that the voltage at the collector terminal of transistor T12 is $V_{cc}-2$ VBE+VSAT. Transistor T11 operates under inverse conditions, i.e. its base-emitter junction is reversed-biased, whereas its base-collector junction is forward biased. Across the last-mentioned junction there is a voltage drop VBE and an equal voltage drop between the base and emitter terminal of transistor T2, so that the voltage at the emitter terminal of transistor T2 is $V_{cc}-2$ VBE+VSAT.

As has previously been stated, when the sink stage 2 is turned on, the voltage drop between the collector terminal and emitter terminal of power transistor T2 is 2 VBE−VSAT (approx. 1.3 V). The power dissipation in transistor T2 is therefore very high, greater than would occur in the absence of transistors T12 and T11 and if the base terminal of transistor T1 were directly coupled to the output of amplifier A1, in which case the voltage drop between the collector and emitter terminals of transistor T2 would be VBE+VSAT (about 0.8 V). In this situation, there is a further dissipation of power transistor T11.

When the sink stage 2 is turned off, diode D2 is conductive and there is a voltage drop VBE between the anode and cathode, i.e. the voltage at the emitter terminal of transistor T11 is $V_{cc}$+VBE, greater than the supply voltage. In this situation, transistor T11 operates in saturation, with a voltage drop VSAT between the emitter and collector terminals, and the voltage at the base terminal of transistor T2 is $V_{cc}$+VBE−VSAT. Transistor T1, on the other hand, is blocked and the base terminal of transistor T12, which is conductive, receives current from the supply via resistor R1. Transistor T2 is also conductive with a voltage drop VBE between the base and emitter terminals so that its emitter terminal is at the voltage $V_{cc-VSAT}$.

The voltage drop between the collector and emitter terminals of the power transistor T2 is therefore VSAT, considerably less than the voltage drop 2VBE−VSAT which occurs when the sink stage is turned on, thus substantially reducing the power dissipation of transistor T2.

It can clearly be seen from the control circuit in FIG. 1 that when the input signal VIN is at high level the circuit is in the reverse situation from that described. More precisely, source 1 and sink 2 are turned off, source 2 is turned on, the regulating circuit alternately turns on and off sink 1, and diode D1 becomes conductive when sink 1 is turned off. On the other hand, there is no change in the operation of the control circuit, more particularly of the source stage when turned on.

When the logic signal VIN switches from low level to high level, the current in the load impedance is reversed. Since the load impedance is inductive, the direction of the current cannot change instanteously and there is therefore a transient in which the current decreases to zero and then reverses and increases. During this transient, source 1 and sink 2 are turned off and diodes D2 and D3 become conductive and discharge the energy accumulated by the inductance. When the current falls to zero, source 2 and sink 1 become operative.

When the logic signal VIN switches from high level to low level the situation is similar and the same function is performed by diodes D1 and D4.

As has been seen, in order to limit the voltage drop and consequently the dissipation in the source power stage of an amplifier [which in FIG. 1 is a single transistor (T2 and T4) but in practical embodiments can be a more complex structure, e.g. a Darlington circuit], when the sink stage of the other amplifier is turned off by regulating circuit, there is need for a circuit which can use the voltage in excess of the supply voltage which is present at the anode terminal of the recycling diode which is conductive. To this end, in a prior-art control circuit shown in FIG. 1, use is made of the two pairs of transistors T11, T12 and T9, T10. As has been seen, however, this circuit considerably increases the power dissipated by the source stage when the sink stage is turned on. This power dissipation has such an adverse effect on the operation of the control circuit that the previously-mentioned solution is useless in practice.

Figure 2:
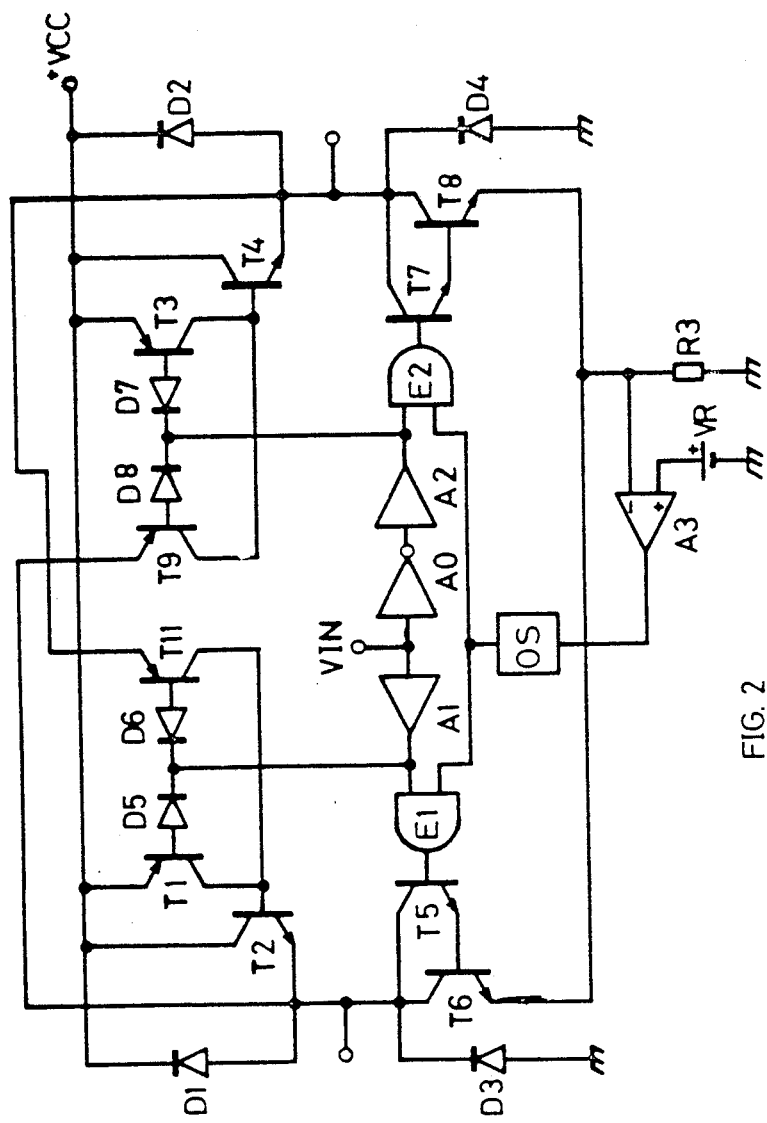
FIG. 2 is a diagram of a control circuit of the kind shown in FIG. 1, modified according to the invention.

The operation of a circuit of the kind shown in FIG. 1 is appreciably improved, according to the invention, if transistor T12 and resistor R1 are replaced by a pair of diodes D5 and D6, and transistor T10 and resistor R2 are replaced by a pair of diodes D7 and D8, thus obtaining a circuit of the kind shown in FIG. 2. Diodes D5 and D6 have their cathodes interconnected and are coupled to the output terminal of operational amplifier A1, and their anode terminals are coupled to the base terminal of transistor T1 and transistor T11 respectively. The cathode terminal of diodes D7 and D8 are likewise coupled together and to the output terminal of amplifier A2, the anode terminals of diodes D7 and D8 are coupled to the base terminal of transistors T3 and T9 respectively.

In the control circuit shown in FIG. 2, as before, operation does not change in response to a change in the level of the input signal VIN, and consequently the operation of the circuit will be described only in the case when VIN is at low level.

As in the circuit in FIG. 1, when the logic signal VIN is at a low level, the sink 1 and source 2 are blocked, source 1 is turned on and sink 2 is alternately turned on and off by the regulating circuit. When sink 2 is turned on, transistor T11 is blocked and consequently diode D6 is also blocked, whereas transistor T1 and diode D5 are conductive. Transistor T1 operates in saturation, the voltage drop between the emitter and the collector terminals being VSAT, so that the base terminal of transistor T2 is at the voltage $V_{cc}-$VSAT. The resulting voltage drop across the base-emitter junction of transistor T2, which is conductive, is VBE, so that the emitter terminal of transistor T2 is at the voltage $V_{cc}-$VBE$-$VSAT.

As previously stated, when sink 2 is turned on, the voltage drop between the collector and emitter terminals of transistor T2 is VBE$-$VSAT, substantially lower than the voltage drop in the same situation in the control circuit in FIG. 1, and thus considerably reducing the power dissipated by the source stage 1.

When sink 2 is turned off, diode D2 is conductive and the emitter terminal of transistor T11 is at the voltage $V_{cc}+$VBE, so that transistor T11 and diode D6 are conductive. The voltage drop across the emitter-base junction of transistor T11 and also across diode D6 is VBE, so that the cathode terminals of diodes D6 and D5 are at the voltage $V_{cc}-$VBE. The resulting potential difference between the emitter of T1 and the anode of D5 ls VBE, insufficient for transistors T1 and T5 to conduct, so that they are blocked. Transistor T11 is saturated and there is a voltage drop VSAT between its emitter and collector terminals and a voltage drop VBE across the base-emitter junction of transistor T2, so that the emitter terminal of transistor T2 is at the voltage $V_{cc}-$VSAT.

Between the collector and the emitter terminals of transistor T2, therefore, the voltage drop is VSAT, less by VBE than the voltage drop VBE+VSAT which occurs when the sink stage 2 is turned on. This considerably reduces the power dissipation in transistor T2.

The foregoing discussion is included to illustrate the operation of the preferred embodiment and is not means to limit the scope of the invention. The scope of the invention is to be limited only by the following claims. Many variations will be apparent to one skilled in the art that would yet be encompassed by the spirit and scope of the invention.

What is claimed is:

1. A monolithically integratable control circuit for switching currents through inductive load impedances, comprising:
   an input stage (A1, A0, A2) switched via a logic signal (VIN) and having a first output terminal generating a signal at the same level as the logic signal and a second output terminal generating a signal at an inverted level relative to the logic signal;
   an actuating state (R3, A3, VR, OS) having an input terminal and an output terminal;
   a first and a second power amplifier in push-pull arrangement, each comprising:
   a first stage (T1, T2, T11, D5, D6 and T3, T4, T9, D7, D8) including a first supply terminal coupled to a first terminal of a supply source, an output terminal constituting the output terminal of the power amplifier to which the stage belongs, a second supply terminal coupled to said output terminal of the other power amplifier and two internal control terminals and comprising a circuit means coupled to the two internal control terminals and to an input terminal constituting the input terminal of the stage;
   a second stage (T5, T6 and T7, T8) including a first output terminal coupled to the output terminal of the power amplifier to which the stage belongs, a second output terminal coupled to the input terminal of the actuating stage, and an input terminal; the first power amplifier having the input terminals of the first and second stage connected to the first output terminal of the input stage, the second power amplifier having the input stage and each power amplifier having the input terminals of the first and second stage coupled to the second output terminal of the input terminal of the second stage coupled to the output terminal of the actuating stage, and
   four recycling diodes (D1-D4), comprising a first and a second diode (D1, D2) coupled between the first terminal of a supply source and the output terminals of the first and second power amplifier respectively and a third and fourth diode (D3, D4) inserted between a second terminal of the supply source and the output terminals of the first and second power amplifier respectively;
   each circuit means comprising two unidirectionally conducting components (D5, D6 and D7, D8) coupled in series and in opposite directions of conduction between the two internal control terminals of the stage to which they belong and having their common terminal coupled to the input terminal of the last-mentioned stage each of said two unidirectionally conducting components being arranged to permit current flow in a direction that activates the stages to which they respectively belong.

2. A control circuit according to claim 1 in which the first stage of each power amplifier comprises:
   a first bipolar type PNP transistor (T1 and T3) having its emitter terminal coupled to the first supply terminal and a base terminal coupled to a first one of the two internal control terminals;
   a second bipolar type PNP transistor (T11 and T9) having its emitter terminal coupled to the second supply terminal and its base terminal coupled to the second of the two internal control terminals;
   a bipolar NPN type transistor (T2 and T4) having its emitter terminal coupled to the output terminal of the first stage, and
   the second stage of each power amplifier comprises:
   a first bipolar type NPN transistor (T5 and T7) having its base terminal coupled to the input terminal of the second stage, and
   a second bipolar type NPN transistor (T6 and T8) having a collector terminal and an emitter terminal respectively coupled to the first and the second output terminal of the second stage;
   the two unidirectionally conducting components (D5, D6 and D7, D8) in each circuit means being two diodes and their common terminal being coupled to the junction point between the cathodes thereof.

3. In a switching amplifier circuit having a first and second power output element for use with an inductive load impeadance, a control circuit comprising:

input transistor means having an emitter terminal coupled to a positive supply voltage terminal and a collector terminal coupled to said first power output element for controlling said first power output element in response to an input signal;

a first diode having an anode terminal coupled to said second power output element and a cathode terminal coupled to said input signal;

a feedback transistor means having an emitter terminal coupled to said second power output element and a collector coupled to said first output power element for controlling said first power output element when a current through a first terminal of said inductive load impedance is applied to said positive voltage terminal; and a second diode having an anode terminal coupled to a base of said feedback transistor means, a cathode terminal of said second diode coupled to the cathode terminal of said first diode and to said input signal.

4. The control circuit of claim 3 wherein said first output power element is a power transistor, and wherein a base terminal of said power transistor is coupled to said input transistor means collector terminal and to said feedback transistor means collector terminal.

5. The control circuit of claim 3 further comprising:

second input transistor means having an emitter terminal coupled to a positive supply voltage terminal and a collector terminal coupled to a second power output element for controlling said second power output element in response to an inverted input signal;

a third diode having an anode terminal coupled to a base terminal of said second input transistor means;

second feedback transistor means having an emitter terminal coupled to said first power output element and a collector terminal coupled to said second input power element for controlling said second power output element when current through a second terminal of said load impedance is applied to said positive voltage terminal; and a fourth diode having an anode terminal coupled to a base terminal of said feedback transistor means, a cathode terminal of said fourth diode coupled to a cathode terminal of said third diode and to said inverted input signal.

6. The control circuit of claim 5 wherein said first and said second output power elements are NPN power transistors, said input and feedback transistor collector terminals being coupled to a base terminal of said first output power transistor, said second input and said said second feedback transistor collector terminals being coupled to a base terminal of said second output power transistor.

7. The control circuit of claim 6 wherein said feedback transistor means has said emitter terminal coupled to an emitter terminal of said second output power transistor and wherein said second feedback transistor means has said collector terminal coupled to an emitter terminal of said first output power transistor.

8. In a switching amplifier for use with an inductive load impedance, wherein said switching amplifier includes two amplifiers, each amplifier having a source stage and a sink stage, wherein an output transistor for each source stage is controlled by a first, second and third transistor and a resistor, a base terminal of said output transistor being coupled to collector terminals of said first and said third transistors, an emitter terminal of first transistor coupled to a positive supply terminal, a collector terminal of said second transistor coupled to a base terminal of said third transistor, an emitter terminal of said third transistor coupled to output terminal of another amplifier, said resistor having one terminal coupled to base terminals of said first and said second transistors, an input signal being coupled to an emitter terminal of said second transistor, the method of reducing power dissipation in said output transistor comprising the step of:

replacing said second transistor and said resistor with first and second diodes, said diodes having anode terminals coupled to base terminals of said first and said third transistors respectively, said diodes having cathode terminals coupled together and coupled to said input signal.

9. In a switching amplifier for providing current to an inductive load impedance wherein a base terminal of an output power transistor of a first source stage is coupled to a collector of a first and a second PNP transistors, said first transistor having an emitter terminal coupled to a positive power supply terminal, an emitter terminal of said second transistor coupled to a second sink stage, apparatus for reducing power dissipation in said output power transistor comprising:

first voltage means for reducing voltage across said output power transistor when said second sink stage is conducting; and second voltage means for reducing voltage across said output power transistor when said second sink stage is cut off.

10. The apparatus for reducing power dissipation of an output power transistor of claim 9 wherein said first voltage means includes a diode having an anode terminal coupled to a base terminal of said first transistor, a cathode terminal of said diode coupled to an input signal.

11. The apparatus for reducing power dissipation of an output power transistor of claim 9 wherein said second voltage means includes a diode having an anode terminal coupled to a base terminal of said second transistor and a cathode terminal coupled to said input signal.

12. In a switching amplifier having a first and a second amplifier, each of said amplifiers having a source stage and a sink stage, wherein an alternating input signal first activates a source stage of one amplifier and a sink stage of the other amplifier and thereafter activates a source stage of said other amplifier and a sink stage of one amplifier, said switching amplifier further including a regulating circuit for disabling a regulating sink stage in response to predetermined conditions, a method of reducing power dissipation in an output power transistor associated with each amplifier comprising the steps of:

applying said input signal to the cathode terminal of a first diode, said first diode having an anode terminal coupled to a base terminal of a transistor having an emitter terminal coupled to a positive voltage supply terminal and a collector terminal coupled to a base of said power transistors; and applying a signal resulting from said disabling to an emitter terminal of a second transistor, said second transistor having a collector terminal coupled to said base terminal of said output power transistor, wherein an anode terminal of a second diode is coupled to a base terminal of said second transistor, and wherein a cathode terminal of said second diode is coupled to said first diode cathode terminal.

* * * * *